United States Patent [19]

Majos et al.

[11] 4,027,147
[45] May 31, 1977

[54] BINARY MULTIPLICATION UNIT WITH PARTIAL PRODUCT AND SUM CALCULATION TIME HIGHER THAN MULTIPLICAND BIT INTERVAL

[76] Inventors: Jacques Majos, Batiment AC2, 223 boulevard d'Armor; Jean-Louis A. Lardy, Les Fontaines Batiment 22, both of Lannion, France, 22300

[22] Filed: Feb. 18, 1976

[21] Appl. No.: 659,038

[30] Foreign Application Priority Data

Feb. 19, 1975   France ............................ 75.05161

[52] U.S. Cl. ................................................. 235/164
[51] Int. Cl.$^2$ ........................................... G06F 7/54
[58] Field of Search .................................. 235/164

[56] References Cited
UNITED STATES PATENTS

| | | | |
|---|---|---|---|
| 3,794,820 | 2/1974 | Robinson | 235/164 |
| 3,805,043 | 4/1974 | Clary | 235/164 |
| 3,816,732 | 6/1974 | Jackson | 235/164 X |
| 3,947,670 | 3/1976 | Irwin et al. | 235/164 |
| 3,956,622 | 5/1976 | Lyon | 235/164 |

*Primary Examiner*—David H. Malzahn

[57] ABSTRACT

Binary multiplication unit for multiplying a plurality of successively entering multiplicands by a common multiplier. The unit admits a high rate incoming and outgoing flow of data, but the time for implementing a multiplication is relatively long and substantially greater than the time separating two successively entering multiplicands. The unit comprises means for receiving a multiplier word and successive multiplicand words and for partitioning the multiplicands into multiplicand subwords. To the multiplicand subwords there corresponds shifted mutliplicand subwords which are deprived of their lowest weight bit and completed by a highest weight bit which is the lowest weight of the adjacent multiplicand subword. The shifted subwords are multiplied by the first bit of the multiplier word and the subwords are multiplied by the second bit of the multiplier word, and the partial products obtained are added to form first "subsum" words. To the subsum words correspond shifted subsum words derived from the subsum words in the same way as the shifted subwords are derived from the subwords. The subwords are multiplied by the third bit of the multiplier and the partial products thus obtained are added to the first shifted subsum words to form second subsum words. The subwords are then multiplied by the fourth bit of the multiplier and the partial products thus obtained are added to the second shifted subsum words to form third subsum words and so on.

2 Claims, 5 Drawing Figures

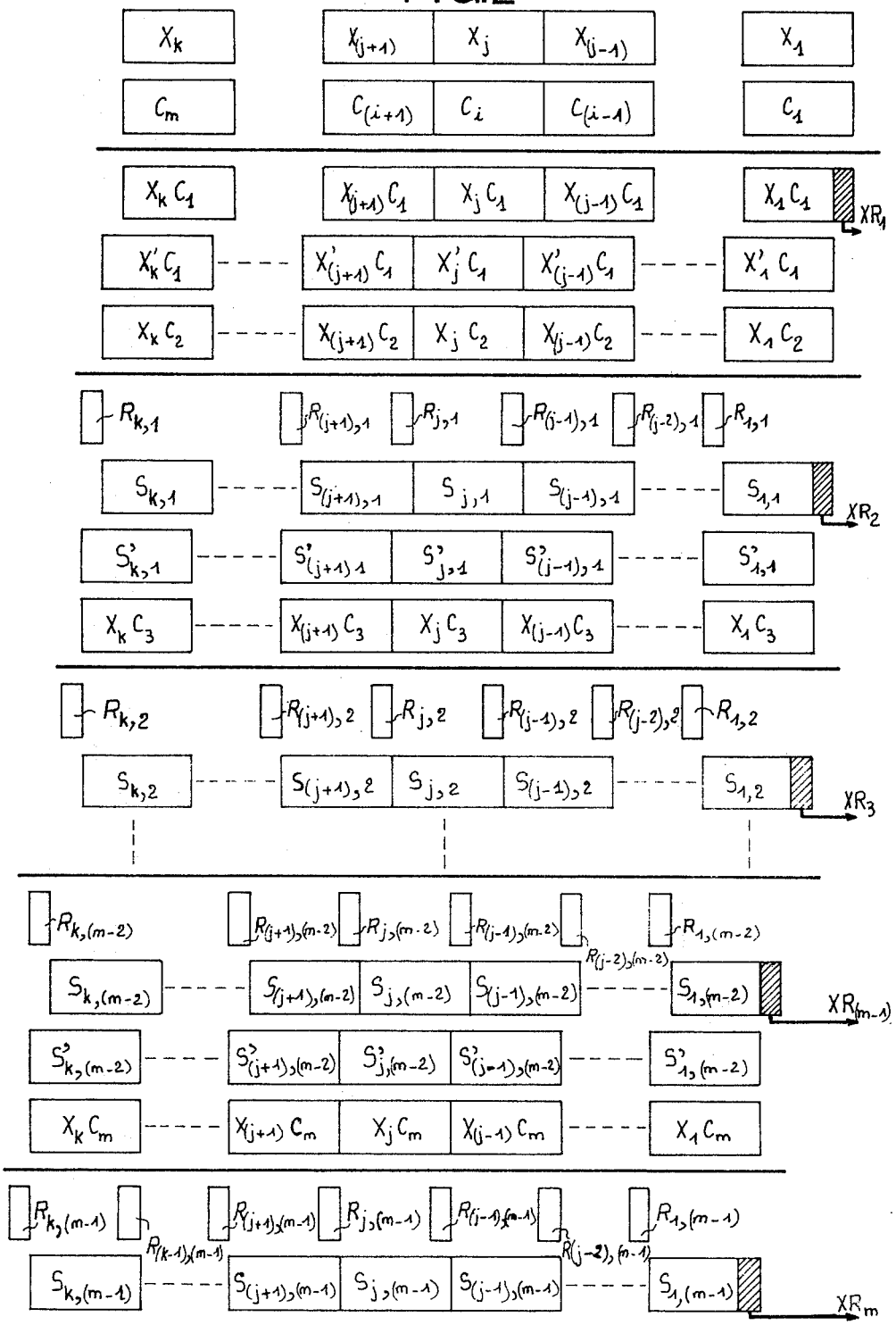

ers of a binary function $y$ or $x$ by binary coefficients

BINARY MULTIPLICATION UNIT WITH PARTIAL PRODUCT AND SUM CALCULATION TIME HIGHER THAN MULTIPLICAND BIT INTERVAL

The present invention generally relates to digital multiplier circuits such as those comprised in linear digital filters.

BACKGROUND OF THE INVENTION

It is known that a digital filter of order $r$ permits, knowing the first discrete values $r$ of an output digital function $y$ and the most recent $s + 1$ values of an input digital function $x$, of determining the new value of the output function:

$$y(nT) = \sum_{i=0}^{s} L_i x(nT - iT) - \sum_{j=1}^{r} K_j y(nT - jT) \qquad (1)$$

If the filter is of the first order, the finite difference equation (1) can be written ($i = 0; j = 1$):

$$y(nT) = x(nT) + K y [(n-1)T]$$

A digital filter therefore contains one or more multipliers of a binary function $y$ or $x$ by binary coefficients $K_i$ and $L_i$.

A digital filter is the more interesting the larger is the number of channels it can process, i.e., the higher is the rate of the input signal to the filter. In this case, the samples or P.C.M. words of the input digital signal follow one another at a very rapid rate and it is necessary for a multiplication relating to a P.C.M. word to be terminated when the following word reaches the digital filter.

Referring by anticipation to FIG. 1, if one considers the digital filter comprising the adder 1, the multiplier 2 and the delay circuit 3 and if $T$ is the duration of a frame, $t_+$ the addition time in the adder 1, $t_\times$ the multiplication time in the multiplier 2 and $t$ the delay time of the delay circuit 3, one must have:

$$T \geq t_+ + t_\times + t$$

If $n$ is the number of channel time slots, the duration of a time slot is $T/n$ and one must have $t_+ \leq T/n$
$t_\times \leq T/n$ With a conventional parallel-series multiplication the multiplication time of which is $t_\times = 1 \ \mu s$ and assuming $T = 125 \ \mu s$, one can treat the maximum of $n \leq 125/1 = 125$ channels In order to increase the number of channels, $t_+$ and $t_\times$ must be reduced.

Now, it can be observed that, if a word is applied to the input of the adder 1 at the moment 0, it leaves the adder 1 after addition at the moment $t_+$ and the result of its multiplication by the coefficient $K$ must appear on the other input of the adder 1 at the moment $T$. The computation time of the multiplication is therefore at the utmost $t-t_+$.

Nevertheless, the words must apply to the multiplier 2 at the rate $T/n$. It will therefore be seen that in the digital filtering field, the result of the multiplication is not needed immediately and that what is important is not the computation time but the number of times of information treated per second.

DESCRIPTION OF THE PRIOR ART

A high speed multiplication circuit is disclosed in U.S. Pat. No. 3,795,880, issued Mar. 5, 1974 to Shanker Singh and Ronald Waxman. In this patent, with $m$ representing the number of bits in the multiplier and $n$ representing the number of bits in the multiplicand, a partial product array comprises $m$ rows and $m + n - 1$ columns, where each row is shifted one bit to the left of the previous row in order to take into account the arithmetic weight of the multiplier bit corresponding to its associated row.

A partial product is simultaneously generated in the partial product array. Since the value of each bit position of a binary number is either 0 or 1, the product of a 0 or 1 times the multiplicand will either be a 0 or the binary value of the multiplicand itself. Thus, the partial product array is capable of being simultaneously filled by allowing a register position in each predetermined skewed row to be altered for each bit of the multiplicand. Additionally, an input is applied to the appropriate register position of each row corresponding to the multiplicand bits. The output of reach register position may then be logically combined, for example, by an AND operation with the appropriate multiplier bit in order to yield the true value of that particular bit by bit multiplication. The true values obtained in each column are then simultaneously applied to a multi-operand adder in order to yield the results of the multiplication operation. Accordingly, the prior art multiplication requires that (1) the multiplier and multiplicand be selectively stored; and (2) the partial product array be simultaneously formed by applying the multiplicand bits into appropriate partial product array register positions, as logically determined by the multiplier bits; and (3) the outputs of the partial product array be combined in a multi-operand adder.

The object of this prior art multiplication unit is only to decrease the multiplication operation time and, in the case where it is used in the digital filter field to multiply successive multiplicands by the same multiplier, it remains engaged and is unable to accept a new multiplicand as long as the multiplication operation relative to the prior multiplicand is not terminated.

OBJECT OF THE INVENTION

The object of the present invention if to provide a multiplication unit having a high input signal rate and a relatively long calculation time.

Another object of the present invention is to provide a multiplication unit receiving an input signal of successive multiplicand words, the bit time intervals of these words being for example lower than the necessary duration to the calculation of two consecutive partial products of two bits and the calculation of the sum of these consecutive partial products.

Another object of the present invention is to provide a multiplication unit designed for continuously multiplying successively entering multiplicand words by the same multiplier and accepting new multiplicands before the multiplication of the prior multiplicands is totally implemented.

SUMMARY OF THE INVENTION

According to the invention, the multiplicand words are partitioned into a plurality of multiplicand subwords and corresponding to each multiplicand subword, each of these comprising at least one binary element, it is formed a shifted multiplicand subword derived from the multiplicand subword and the following multiplicand subword by omitting the lowest weight bit of the said multiplicand subword and adding, as the highest weight bit of the shifted multiplicand subword, the lowest weight bit of the following multiplicand subword The shifted multiplicand subwords are multiplied by the bit of weight zero of the multiplier and the multiplicand subwords are multiplied by the bit of weight one of the multiplier and the products thus obtained are added together and form so-called first subsum words. Corresponding to each first subsum word there is formed a first shifted subsum word derived from the first subsum word and the following first subsum word by omitting the lowest weight bit of said first subsum word and adding, as the highest weight bit of the first shifted subsum word, the lowest weight bit of the following first subsum word. The multiplicand subwords are multiplied by the bit of weight two of the multiplier and the products thus obtained are added to the first shifted subsum words and form second subsum words. Corresponding to each second subsum word, there is formed a second shifted subsum word derived from the second subsum word, and the following second subsum word exactly by the same treatment deriving the first shifted subsum word from the first subsum word. Then the multiplicand subwords are multiplied by the bit of weight three of the multiplier and the products thus obtained are added to the second shifted subsum words and form third subsum words. The multiplication is continued by applying the same iterative algorithm.

The minimum time after which the following multiplicand can be applied to the multiplication unit according to the invention is equal to the time necessary to effect the computation of a sum. This time will be designated by $\tau$, in the following.

The foregoing and other objects features and advantages of the present invention will become apparent from the following more particular description of the preferred embodiment of the invention as illustrated in the accompanying drawings.

BRIEF DESCRIPTION OF THE DRAWINGS

FIG. 2 is a chart illustrating the process of multiplication of two binary words in accordance with the present invention;

DESCRIPTION OF THE PREFERRED EMBODIMENT

Figure 1:
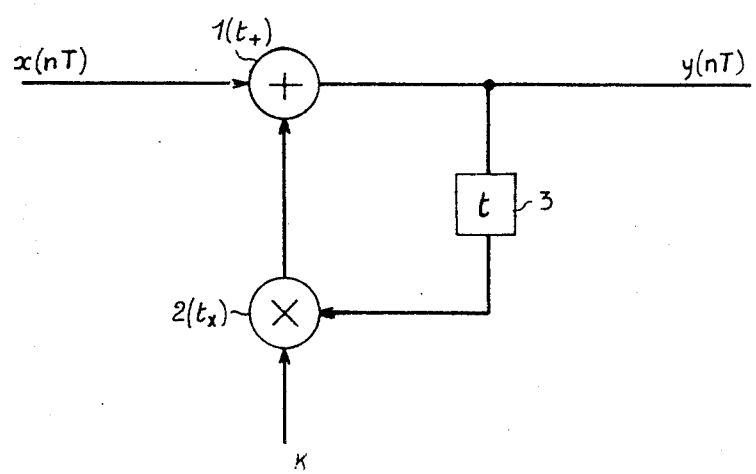
FIG. 1 illustrates a digital filter of the first order and has already been commented on the background of the invention.

Now referring to FIG. 2, it illustrates the general algorithm of the multiplication of two binary words, a multiplicand $X$ and a multiplier $C$. The multiplicand $X$ comprises $n$ bits and is divided into $k$ multiplicand subwords $X_j (1 \leq j \leq k)$ of $q$ bits ($n = kq$) and the multiplier $C$ comprises $m$ bits $C_i (1 \leq i \leq m)$. The multiplication is set and computed in FIG. 2.

Line No. 1 of FIG. 2 of the multiplication comprises the products of the subwords of the multiplicand by the first bit of zero binary weight $C_1$ of $C$:

Line No. 1    $X_k C_1 \ldots X_{j+1} C_1$    $X_j C_1$
$X_{j-1} C_1 \ldots X_1 C_1$ In line No. 2 of FIG. 2, the subwords $X_j$ of line No. 1 have been shifted by one bit to the left to convert them into shifted subwords $X_j'$ and the $X_j'$ has been multiplied by $C_1$:

Line No. 2    $X_k' C_1 \ldots X_{j+1}' C_1$    $X_j' C_1$
$X_{j-1}' C_1 \ldots X_1' C_1$ ($X_j'$ is, as already stated, the word $X_j$ of which there has been omitted to the right the bit of lowest binary weight and to which has been added to the left the bit of lowest binary weight of $X_{j+1}$). The lowest binary weight bit $XR_1$ of the product $X_1 C_1$ is the bit of binary weight zero of the result of the multiplication.

Line No. 3 of FIG. 2 comprises the multiplicand subwords multiplied by the bit of binary weight one $C_2$ of $C$:

Line No. 3    $X_k C_2 \ldots X_{j+1} C_2$    $X_j C_2$
$X_{j-1} C_2 \ldots X_1 C_2$ written just below the subwords of line No. 2. The summation of the lines No. 2 and No. 3 is then made by setting:

$$S_{j,1} = X_j' C_1 + X_j C_2 + R_{(j-1),1} \tag{2}$$

where $S_{j,1}$ is a subproduct sum word and $R_{(j-1),1}$ is the carry of the addition giving $S_{(j-1),1}$.

This sum is written:

Line No. 4    $S_{k,1} \ldots S_{(j+1),1}$    $S_{j,1}$    $S_{(j-1),1}$ .
. . $S_{1,1}$ In Line No. 5 of FIG. 2, the subsum words of Line No. 4 have been shifted by one bit to the left in order to form the shifted subsum words:

Line No. 5    $S_{k',1} \ldots S'_{(j+1),1} S'_{j,1} S_{(j-1),1}' \ldots S'_{1,1}$ It is reminded that $S'_{j,1}$ is the word $S_{j,1}$ of which has been omitted to the right the bit of lowest binary weight and to which has been added to the left the bit of lowest binary weight of $S_{(j+1),1}$. The bit of lowest binary weight $XR_2$ of the subsum word $S_{1,1}$ is the bit of binary weight one of the result of the multiplication.

Line No. 6 of FIG. 2 comprises the multiplicand subwords multiplied by the bit of binary weight two $C_3$ of $C$:

Line No. 6    $X_k C_3 \ldots X_{(j+1)} C_3$    $X_j C_3$
$X_{(j-1)} C_3 \ldots X_1 C_3$ written just below the subsum words of Line No. 5. The summation of the Lines No. 5 and No. 6 is then made by setting:

$$S_{j,i} = S'_{j,(i-1)} + X_j C_{i+1} + R_{(j-1),i} \tag{3}$$

where $R_{(j-1),i}$ is the carry of the addition giving $S_{(j-1),i}$. This sum can be written ($i=2$):

The shifted subsum words $S'_{j,(i-1)}$, are formed again from the subsum words $S_{j,(i-1)}$, then the subsum words $S_{j,i}$ from the shifted subsum words $S'_{j,(i-1)}$ and the products $X_j C_{(i+1)}$ according to formula (3).

The Line No. 8 of FIG. 2 comprises ($= m-2$):

Line No. 8  $S_{k,(m-2)}) \ldots S_{(j+1),(m-2)}$   $S_{j,(m-2)}$
$S_{(j-1),(m-2)} \ldots S_{1,(m-2)}$ The Line No. 9 of FIG. 2 comprises ($i = m-2$):

Line No. 9  $S'_{k,(m-2)}$  $S'_{(j+1),(m-2)}$  $S'_{j,(m-2)}$
$S'_{(j-1),(m-2)} \ldots S'_{1,(m-2)}$ The Line No. 10 of FIG. 2 comprises:

Line No. 10  $X_k C_m \ldots X_{(j+1)} C_m$   $X_j C_m$
$X_{(j-1)} C_m \ldots X_1 C_m$ Line No. 11 of FIG. 2 comprises the carriers:

$R_{k,(m-1)} \ldots R_{(j+1),(m-1)}$  $R_{j,(m-1)}$   $R_{(j-1),(m-1)} \ldots$
$R_{(j-2),(m-1)}$ and the Line No. 12 of FIG. 2 comprises ($i = m-1$):

Line No. 12  $S_{k,(m-1)} \ldots S_{(j+1),(m-1)}$   $S_{j,(m-1)}$
$S_{(j-1),(m-1)} \ldots S_{1,(m-1)}$ The bits of lower weight $XR_3$ of $S_{1,2}$, $XR_{m-1}$ of $S_{1,(m-2)}$ and $XR_m$ of $S_{1,(m-1)}$ are respectively the bits of binary weight two, ($m-2$) and ($m-1$) of the result of the multiplication, which together with $XR_1$ and $XR_2$ form the $m$ bits of low weight of the final product $XR_1$ to $XR_m$.

The ($q-1$) bits of high weight of $S_{1,(m-1)}$, the $q$ bits of the words $S_{2,(m-1)}$ to $S_{k,(m-1)}$ and the bit $R_{k,(m-1)}$ from the $n$ bits of high weight of the result $XR_{(m+1)}$ to $XR_{(m+n)}$.

Figure 3A:
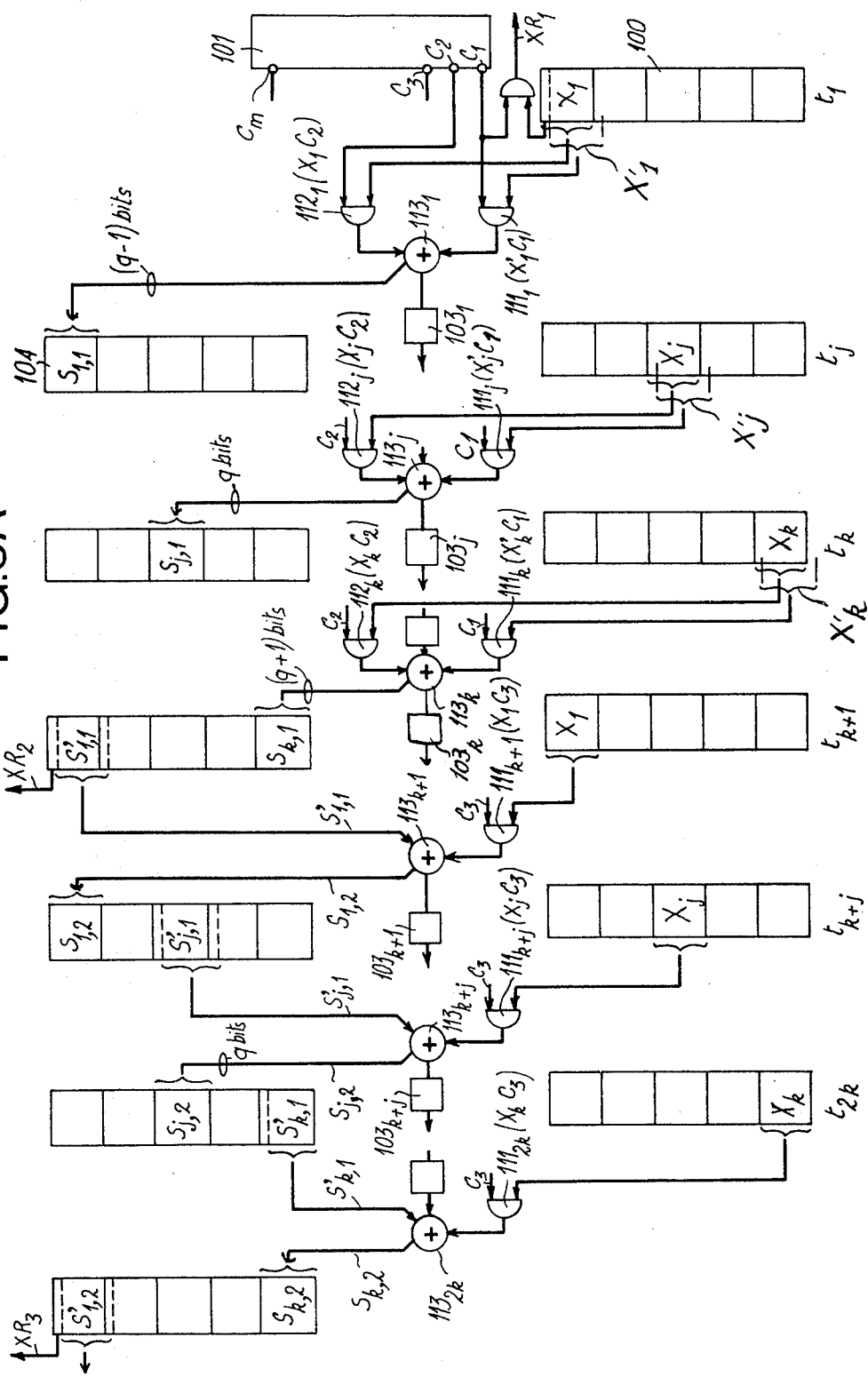
FIGS. 3A and 3B are a schematic block diagram of the binary multiplication unit with high digital rate and relatively long multiplication time of the present invention in the general case of multiplicands with $k$ words of $q$ bits and of a multiplier with $m$ bits.
Figure 3B:
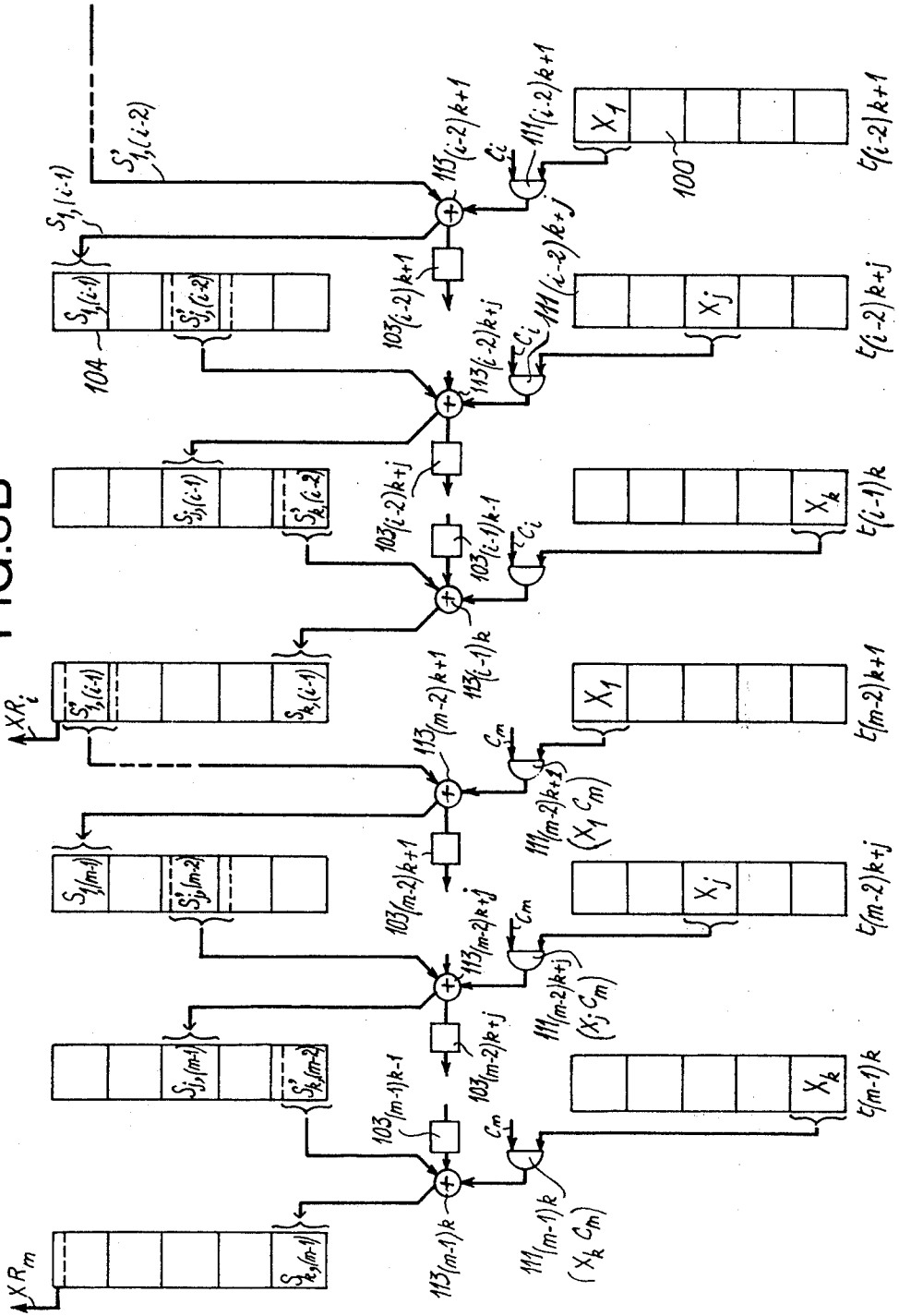

Now referring to FIG. 3, 100 represents the input multiplicand register in which the multiplicand $X$ is partitioned into subwords $X_1$ to $X_k$ in the partial registers $100_1$ to $100_k$. Each partial register has two outputs, on one of which appears the subword $X_j$, on the other of which appears the shifted subword $X'_j$, i.e., by cutting to its right its bit of lowest binary weight and by adding to its left the bit of lowest binary weight of the following subword $X_{(j+1)}$. At the moment $t_1$, the shifted subword $X'_1$ is applied to AND gate $111_1$ at the same time as $C_1$ supplied by a register 101 containing the multiplier C, and the subword $X_1$ is applied to AND gate $112_1$ at the same time as $C_2$ supplied by register 101 (in fact, each gate 111 ($111_1$ to $111_{(m-1)k}$) and each gate 112 ($112_1$ to $112_k$) includes respectively a group of $q$ gates but there is shown respectively only one gate in FIG. 3 in order to not overload it). The adder $113_1$ supplies the carry $R_{1,1}$ and the subsum $S_{1,1}$. This carry is stored in the register $103_1$ and this sum is stored in the register 104.

At the moment $t_j$, the shifted subword $X_j'$ is applied to AND gate $111_j$ at the same time as $C_1$, and the subword $X_j$ is applied to AND gate $112_j$ at the same time as $C_2$. The adder $113_j$ supplies the carry $R_{j,1}$ and the subsum $S_{j,1}$ which are stored respectively in the registers $103_j$ and 104.

At the moment $t_k$, the shifted subword $X_k'$ is applied to AND gate $111_k$ at the same time as $C_1$, and the subword $X_k$ is applied to AND gate $112_k$ at the same time as $C_2$. The adder $113_k$ supplies the carry $R_{k,1}$ and the subsum $S_{k,1}$ which are stored respectively in the registers $103_k$ and 104.

At the moment $t_{(k+1)}$, the subword $X_1$ is applied to AND gate $111_{(k+1)}$ at the same time as $C_3$, and the shifted subsum $S'_{1,1}$ (i.e., by cutting to its right its bit of lowest binary weight and by filling to its left as the bit of highest binary weight with the bit of lowest binary weight of the following subsum $S_{2,1}$) together with the subproduct $X_1 C_3$ supplied by AND gate $111_{(k+1)}$ is applied to the adder $113_{(k+1)}$. This latter adder supplies the carry $R_{1,2}$ and the subsum $S_{1,2}$ which are stored respectively in the registers $103_{k+1}$ and 104.

At the moment $t_{(i-2)k+1}$, the subword $X_1$ is applied to AND gate $111_{(i-2)k+1}$ at the same time as $C_i$, and the shifted subsum $S'_{1,(i-2)}$ together with the subproduct $X_1 C_i$ coming from AND gate $111_{(i-2)k+1}$ are supplied to the adder $113_{(i-2)k+1}$. This latter supplies the carry $R_{1,(i-1)}$ and the subsum $S_{1,(i-1)}$ which are respectively stored in the registers $103_{(i-2)k+1}$ and 104.

At the moment $t_{(i-2)k+j}$, the subword $X_j$ is applied to AND gate $111_{(i-2)k+j}$ at the same time as $C_i$, and the shifted subsum $S'_{j,(i-2)}$ together the subproduct $X_j C_i$ coming from AND gate $111_{(i-2)k+j}$ are applied to the adder $113_{(i-2)k+j}$. This latter adder supplies the carry $R_{j,(i-1)}$ and the sum $S_{j,(i-1)}$ which are stored respectively in the registers $103_{(i-2)k+j}$ and 104.

The structure of the complete multiplier results sufficiently from that of the stages which have been described.

The register 100 is a shift register in which the multiplicand advances step by step and is accessible at the moments:

| $t_1$ | $t_j$ | $t_k$ |
| $t_{k+1}$ | $t_{k+j}$ | $t_{2k}$ |
| $t_{(i-2)k+1}$ | $t_{(i-2)k+j}$ | $t_{(i-1)k}$ |
| $t_{m-2)k+1}$ | $t_{(m-2)k+j}$ | $t_{(m-1)k}$ |

The carry $R_{(j-1),(i-1)}$ is transmitted to the adder $113_{(i-2)k+j}$ at the moment $t_{(i-2)k+j}$ at the same time as $X_j$ and $C_i$. The sum $S_{j,(i-1)}$ is obtained after a time $\tau$, i.e., at the moment $t_{(i-2)k+j} + \tau$.

Let us suppose now that:
$$\tau + p$$
where $p$ is the period of the operating cycle of the multiplier:
$$p = t_x - t_{x-1}$$

The sum $S_{j,(i-1)}$ or, more generally, any sum $S_{j,i}$ must be memorized during a time $t_M$ $$t_M = t_{(i-1)k+j} - [\, t_{(i-2)k+j} + p \,]$$
$$t_M = (k-1)p \qquad (4)$$

This duration of storing is not exact for all the bits of $S_{j,i}$ and it is advisable to study the following particular cases:

1. $S_{j,i}$ with $j=1$ and $i \neq m-1$

The first right bit of all the $S_{1,i}$ is a bit of the result. Therefore in this case there are only ($q-1$) bits which are memorized during:

$$(k-1)p \text{ seconds} \qquad (5)$$

2. $S_{j,i} j \neq 1 \; j \neq k \; i \neq m-1$

The first right bit of $S_{j,i}$ is used at the moment
$$t_{(i-1)k+(j-1)}$$
because it is the highest weight of $S'_{(k-1),i}$ which is used for the computation of $S_{(j-1),(i+1)}$. The ($q-1$) remaining bits are used at the moment
$$t_{(i-1)k+j}$$
and are used for the computation of $S_{j,(i+1)}$ obtained at the moment
$$t_{(i-1)k+j} + p$$

Therefore, for $S_{j,i}$ and with the conditions indicated for $i$ and $j$:

1 bit is memorized during ($k-2$)$p$ seconds  (6)

($q-1$) bits are memorized during ($k-1$)$p$ seconds  (7)

3. $S_{k,i} \; 1 \neq m-1$

The case is similar with the preceding one but 1 bit more is to memorize: that is the carry.

Therefore for $S_{k,i}$:

1 bit is memorized during $(k-2)p$ seconds     (8)

$q$ bits are memorized during $(k-1)p$ seconds     (9)

4. $S_{j,i}$ $i=m-1$

The $k$ last partial results, i.e., $S_{1,(m-1)}$ to $S_{k,(m-1)}$, are particular and for each the storing time is different:

$S_{k,(m-1)}$ is not memorized     (10)

$S_{(k-1),(m-1)}$ is memorized during $p$ seconds     (11)

$S_{2,(m-1)}$ is memorized during $(k=2)p$ seconds     (12)

$(q-1)$ bits of $S_{1,(m-1)}$ are memorized during $(k-1)p$ seconds     (13)

Capacity of The Memory of Partial Results 104

Now one can calculate the capacity of the memory adapted to the storing of the $S_{j,i}$ knowing that if a partial result $S_{j,i}$ is memorized during $(x-1)p$ seconds, there is a production during this time of $x$, partial results and therefore production of $xq$ or of $x(q-1)$ bits according to the words have $q$ bits or $(q-1)$ bits.

1. $S_{j,i}$ with $j=1$ and $i \neq m-1(q-1)$ bits are memorized during $(m=1)p$ seconds
   capacity     $k(q-1)$ bits     (5')

2. $S_{j,i}$ with $j \neq 1$  $j \neq k$  $i \neq m-1$ capacity
   $[(k-)q+q-1]$ $(k-2)$ bits     (6'),(7')

3. $S_{k,i}$     $i \neq m-1$ capacity     $(k-1)(q+1)+q$ bits     (8'),(9')

that is for adding up for the cases 1,2,3,:

$(m=2)$ $(k^2q-k+1)$ bits

4. $S_{j,i}$  $i = m-1$ capacity $S_{k,(m-1)}$:0 bit     (10')

$S_{(k-1),(m-1)}$:$q$ bits     (11')

$S_{j,(m-1)}$:$k-j)q$ bits     (12')

$S_{1,(m-1)}$:$(k-1)$ $(q-1)$ bits     (13')

that is for adding up for the case 4:

$$\left[\sum_{j=1}^{k}(k-j)q\right] - (k-1) = \frac{k(k-1)q}{2} - (k-1)$$

The total capacity $C_S$ of the memory or partial results is:

$$C_S = (m-2)[k^2q - k + 1] - (k-1) + \frac{k(k-1)q}{2} \text{ bits}$$

Multiplicand Memory 100

In this memory 100, the multiplicand is stored during the whole time it is used, i.e., during the time necessary for the computation of all the $S_{j,i}$ corresponding to this multiplicand, that is $t_M = (m-1)kp$ seconds     (14)

During this time, $(m-1)k$ multiplicands are entered in the memory 100. The capacity $C_M$ of the multiplicand memory is $$C_M = (m-1)kn = (m-1)k^2q \text{ bits}$$
$$C_M = (m-1)k^2 \text{ words}$$     (15)

The rate of the multiplier circuit is $$C_M/t_M = \frac{(m-1)k^2}{(m-1)kp} = k/p$$

In an elementary cycle of $p$ seconds, the multiplication unit treats $(m-1)k$ words among $(m-1)k^2$ words.

APPLICATION (FIG. 4)

It assumed that it is desired to filter 120 digital channels sampled at the frame frequency 560 kHz which corresponds to a frame of a duration of $T = 1/560.10^3 = 1.785$ $\mu s$ and to time slots of a duration of $p = 1.785/120 = 14.88$ ns and it is assumed that the values of $n$ and $m$ are:

$n = 16$ (multiplicand of 16 bits)

$m = 15$ (multiplier of 15 bits)

and that the circuits are components of the series ECL 10K and in particular the arithmetical unit 10181 with 4 bits. The computation time of this unit is $\tau_4 = 7$ ns for the sum and $\tau_r = 4$ for the carry.

In addition, the registers 100 and 104 are registers of the type 10141 with a transfer time $\theta$ of 2.5 ns.

The cycle $p$ must be greater than or equal to the addition time $\tau_q$ of $q$ bits increased by the transfer time $\theta$ of the register:

$p = 14.88$ ns $\geq \theta \tau_q = 2.5 + \tau_q$ to $= 2.5 + \tau_q$ which gives $\tau_q \leq 12.38$ ns The addition time $\tau_q$ of $q$ bits is connected to the addition time $\tau_4$ of 4 bits by the following equation $$\tau_q = 12.38 = \frac{n-4k}{4k}\tau_r + \tau_4 = \frac{16-4k}{4k} \times 4 + 7$$     (16)

whence $k = 1.72$

One takes $k = 2$ whence $q = n/k = 8$
and by replacing $k$ by 2 in the equation (16):
$\tau_q = 11$ ns
which confirms:
$p = 14.88$ ns $\geq \theta + \tau_q = 2.5 + 11 = 13.5$ ns.

Figure 4:
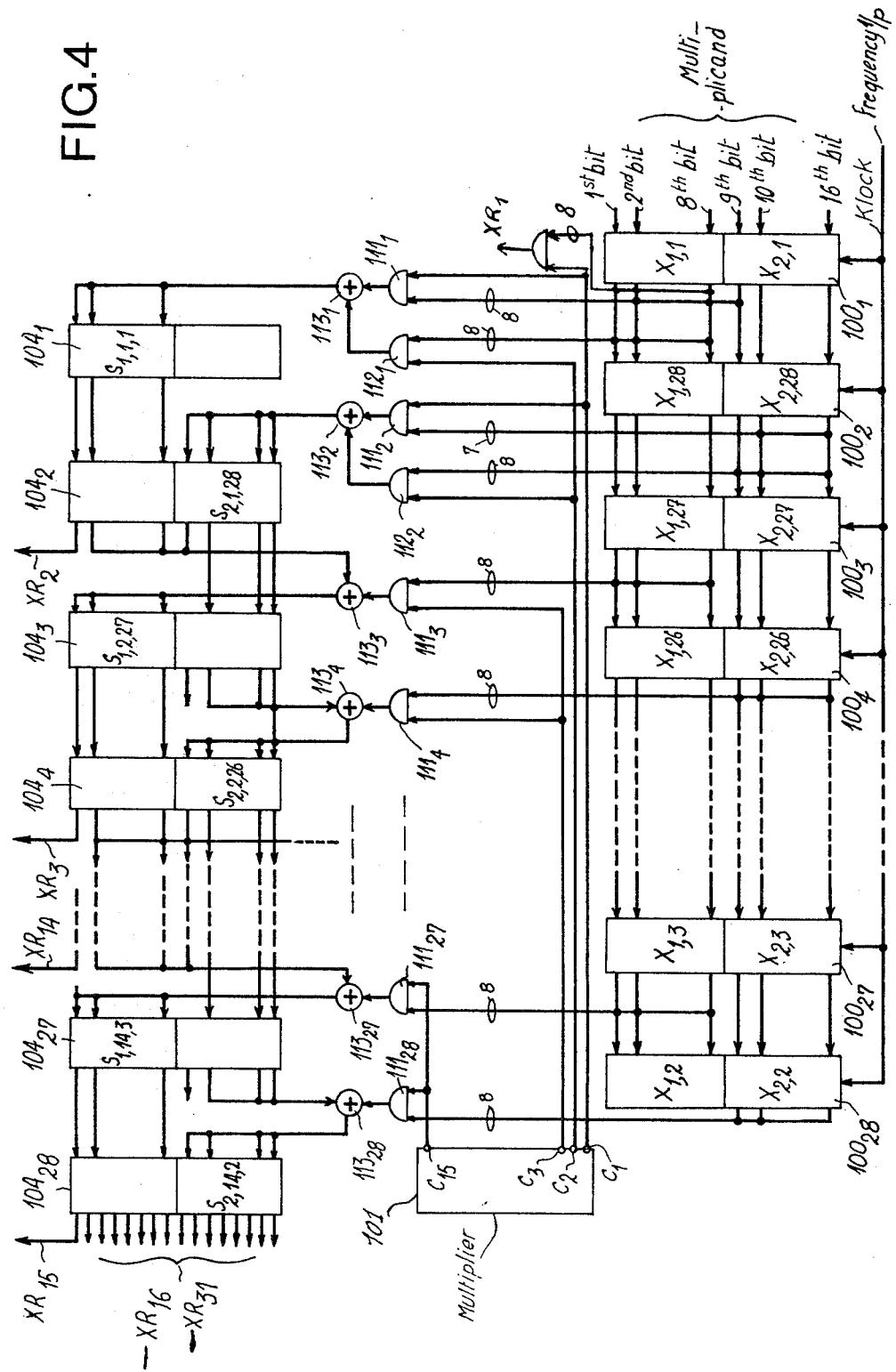
FIG. 4 is another schematic block diagram of the binary multiplication unit with hgh digital rate and relatively long multiplication time of the present invention in the particular case of multiplicands with 2 words of 8 bits and of a multiplier with 15 bits.

Referring now to FIG. 4, there is shown the multiplicand register 100 with $(m-1) \times k = 14 \times 2 = 28$ stages $100_1$ to $100_{28}$ which contains 28 multiplicands each having 16 bits and being divided into two subwords $X_{1,j}$ and $X_{2,j}$ ($1 \leq j \leq 28$). The number of subwords is therefore 56. FIG. 4 also shows the set of 28 address $113_1$ to $113_{28}$.

The register 100 is controlled in progression by a clock at the frequency $1/p$. The successive multiplicands are applied to the first stage $100_1$; then, they are shifted successively up to the stage $100_{28}$ at the outlet of which the memorizing ceases and the multiplicands are lost.

The subwords indicated in the following table are applied respectively to the adders $113_1$ to $113_{28}$. In this table, the X words are referred to with three indexes. The first index is the above-mentioned parameter $j$. The second index is the parameter $i$ varying from 1 to $(m-1)$, i.e., from 1 to 14. For symmetrizing the indices, taking into account that the multiplier bits $C_1$ and $C_2$ are treated in the same group of adders, and then the following bit from $C_3$ to $C_{15}$ are treated one at a time in a group of $k$ adders, the index $i$ instead of starting from 1 and increasing up to 14 included, starts from (1–2) considered as a single value and then increases up to 15 included. The third index designates the number of the multiplicand treated.

TABLE

| | $113_{28}$ | $113_{27}$ | ..... | $113_4$ | $113_3$ | $113_2$ | $113_1$ |
|---|---|---|---|---|---|---|---|
| $t_1$ | $X_{2,15,2}$ | $X_{1,15,3}$ | ... | $X_{2,3,26}$ | $X_{1,3,27}$ | $X_{2,(1-2),28}$ | $X_{1,(1-2),1}$ |
| $t_2$ | $X_{2,15,3}$ | $X_{1,15,4}$ | ... | $X_{2,3,27}$ | $X_{1,3,28}$ | $X_{2,(1-2),1}$ | $X_{1,(1-2),2}$ |
| $t_3$ | $X_{2,15,4}$ | $X_{1,15,5}$ | ... | $X_{2,3,28}$ | $X_{1,3,1}$ | $X_{2,(1-2),2}$ | $X_{1,(1-2),3}$ |
| $t_4$ | $X_{2,15,5}$ | $X_{1,15,6}$ | ... | $X_{2,3,1}$ | $X_{1,3,2}$ | $X_{2,(1-2),3}$ | $X_{1,(1-2),4}$ |
| $t_{27}$ | $X_{2,15,28}$ | $X_{1,15,1}$ | ... | $X_{2,3,24}$ | $X_{1,3,25}$ | $X_{2,(1-2),26}$ | $X_{1,(1-2),27}$ |
| $t_{28}$ | $X_{2,15,1}$ | $X_{1,15,2}$ | ... | $X_{2,3,25}$ | $X_{1,3,26}$ | $X_{2,(1-2),27}$ | $X_{1,(1-2),28}$ |

In FIG. 4, there is shown the contents of the stages of the register 100 at the moment $t_1$.

There is likewise shown in FIG. 4 the register 104 of subsums $S_{j,i}$. This register somprises 28 stages $104_1$ to $104_{28}$. The words shown inside the stages of register 104 comprise three indexes. The first two are the same indexes as those used in FIGS. 3A and 3B; the third index is the number of the multiplicand. Like the register 100, the register 104 is controlled in progression by by a clock at the frequency $1/p$. The contents of the stages of the register 104 are shown at the moment $t_1$.

What we claim is:

1. A binary multiplication unit having a multiplication time substantially higher than the time separating the entering of two successive multiplicand words into the unit, said binary multiplication unit comprising:
   a. a multiplicand storage means for successively storing multiplicand words and a multiplier storage means for permanently storing a predetermined multiplier word;
   b. means for partitioning each multiplicand word into a plurality of multiplicand subwords following one another in increasing binary weight, each multiplicand subword comprising at least one binary element;
   c. means for deriving from each multiplicand subword and the following multiplicand subword a shifted multiplicand subword obtained by omitting the bit of lowest binary weight of the multiplicand subword and adding thereto, as bit of highest binary weight, the bit of lowest binary weight of the following multiplicand subword;
   d. means for multiplying said shifted multiplicand subsords by the first bit of said multiplier word and thus obtaining first subproducts;
   e. means for respectively multiplying said multiplicand subwords by the successive bits of the multiplier word starting from the second bit of said multiplier word and thus obtaining second, third and following subproducts associated with said multiplicant subwords;
   f. means for adding together said first and said second subproducts and thus obtaining subproducts sums following one another in increasing binary weight;
   g. means for deriving from each subproduct sum and the following subproduct sum a shifted subproduct sum obtained by omitting the bit of lowest binary weight of the subproduct sum and adding thereto, as bit of highest binary weight, the bit of lowest binary weight of the following subproduct sum;
   h. means for respectively adding said third and following subproducts associated with each multiplicand subword respectively to third and following shifted subproduct subproduct sums deriving from the subproduct sum associated with the preceeding subproducts of the multiplicand subword and the subproduct sum associated with the preceeding subproduct of the following multiplicand subword; and
   i. means for deriving said third and following shifted subproduct sums, each subproduct sum being obtained by omitting the bit of lowest binary weight of the subproduct sum associated to a given miltiplicand subword and adding thereto, as bit of highest binary weight, the bit of lowest binary weight of the subproduct sum associated with the following multiplicand subword.

2. A binary multiplication unit as set forth in claim 1, in which the multiplicand words are $n$-bit words, the multiplier word is an $m$-bit word, the $n$-bit miltiplicand words are each partitioned into $k$ subwords of $n/k$ bits, said means for multiplying said shifted multiplicand subwords by the first bit of said multiplier word and thus obtaining first subproducts are $k$ AND gates, said means for adding together said first and second subproducts and thus obtaining subproduct sums are $k$ adders, said means for respectively multiplying said multiplicand subwords by the second to $m^{th}$ bits of said multiplier word and thus obtaining said second, third and following subproducts are $(m-1)$ sets of $k$ AND gates and said means for adding together said third and following subproducts and said shifted subproducts sums are $(m-2)$ sets of $k$ adders.

* * * * *